US 6,646,446 B2

(12) United States Patent
Maher et al.

(10) Patent No.: US 6,646,446 B2
(45) Date of Patent: Nov. 11, 2003

(54) METHOD AND APPARATUS FOR FAULT DETECTION IN A RESISTIVE BRIDGE SENSOR

(75) Inventors: Thomas R. Maher, Rehoboth, MA (US); David L. Corkum, Attleboro, MA (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 09/952,257

(22) Filed: Sep. 14, 2001

(65) Prior Publication Data

US 2002/0033700 A1 Mar. 21, 2002

Related U.S. Application Data

(60) Provisional application No. 60/234,091, filed on Sep. 20, 2000.

(51) Int. Cl.[7] .................. G01R 17/10; G01L 25/00; G01D 18/00
(52) U.S. Cl. ................. 324/526; 324/610; 324/725; 73/1.11; 702/88
(58) Field of Search ..................... 324/526, 706, 324/610, 651, 725, 98, 601; 327/84; 340/599; 73/1.11, 1.01, 1.15, 1.88, 763, 862.628; 331/139; 702/88, 104, 107, 117

(56) References Cited

U.S. PATENT DOCUMENTS 5,228,337 A  * 7/1993 Sharpe et al. .............. 73/146.5
6,433,554 B1 * 8/2002 Kawate et al. .............. 324/500
6,489,787 B1 * 12/2002 McFadden .................. 324/725

OTHER PUBLICATIONS

Sasaki et al. ("High–Precision Automated Resistance Measurement Using a Modified Wheatstone Bridge". Precision Electromagnetic Measurements, 1988, CPEM 88 Digest. 1988, Conference on , Jun. 7–10, 1988, pp. 157–157.*

* cited by examiner

Primary Examiner—Anjan K. Deb
(74) Attorney, Agent, or Firm—Russell E. Baumann; Frederick J. Telecky, Jr.

(57) ABSTRACT

A full Wheatstone bridge sensor has conditioning electronics of an ASIC connected thereto. Two independently controlled diagnostic switches (S1, S2) in the ASIC are commonly connected to one of the bridge output nodes. The first diagnostic switch connects first resistor between the bridge output node and bridge supply voltage and the second diagnostic switch connects a second resistor between the bridge output and bridge ground. The first diagnostic switch closes during a first diagnostic waveform phase and opens during all other phases of operation. The second diagnostic switch closes during a second and third waveform phase and opens during all other phases of operation. The diagnostic waveforms are used to test major signal conditioning and fault reporting paths of the ASIC.

10 Claims, 2 Drawing Sheets

METHOD AND APPARATUS FOR FAULT DETECTION IN A RESISTIVE BRIDGE SENSOR

This application claims priority under 35 USC Section 119 (e) (1) of provisional application No. 60/234,091 filed Sep. 20, 2000.

FIELD OF THE INVENTION

This invention relates generally to resistive bridge sensors and more particularly to the detection of faults in full Wheatstone bridge type sensor elements and ASICs (application specific integrated circuits) used therewith.

BACKGROUND OF THE INVENTION

Full Wheatstone bridge sensor elements for sensing a given stimulus such as pressure, acceleration, torque or the like, coupled to ASICs for conditioning the bridge signal are known. The ability to detect sensor faults as well as faults in associated electronics and connectors is of increasing importance in high reliability applications.

SUMMARY OF THE INVENTION

It is an object of the present invention to provide a method and apparatus for detecting bridge faults, ASIC faults and faults external to the sensor in the connection system.

According to one preferred embodiment, two independently controlled diagnostic switches are commonly connected to one of the full Wheatstone bridge output nodes. A first diagnostic switch selectively connects a first resistor between the bridge output node and bridge supply voltage and a second diagnostic switch selectively connects a second resistor between the bridge output node and bridge ground. The first diagnostic switch closes during a first diagnostic waveform phase and opens during all other phases of operation. The second diagnostic switch closes during second and third diagnostic waveform phases and opens during all other phases of operation.

The inability to drive the conditioned output between prescribed output bounds during each phase of diagnostic waveform, e.g., lower supply voltage to upper supply voltage, at any input stimulus (e.g., pressure) level over a prescribed range, is indicative that one or more of the following fault conditions may exist:

excessive supply line resistance,
inoperative conditioning electronics,
resistive shunt across full Wheatstone bridge output nodes,
excessively resistive electrical connections between the sense element and conditioning circuit.

The first resistor value is selected to cause a differential signal across the two full Wheatstone bridge outputs minimally equal to a positive full scale stimulus signal level. The second resistor value is selected to cause a differential signal across the two full Wheatstone bridge outputs maximally equal to a negative full scale stimulus signal level. To maximize sensitivity to detect full Wheatstone bridge output shunts during the diagnostic phases, the first and second resistor values are selected to cause input signals which are both positive and negative and have a magnitude slightly more than a full scale (e.g., 105% full scale) input over the full operating temperature range. Thus, to achieve maximal benefit, the first and second resistor values are trimmed to account for tolerances in bridge resistance and minimum sensitivity over temperature and should have a value that proportionally tracks with $R_{brg}(T)$. Where $R_{BRG}$ is the effective resistance between the bridge voltage supply nodes $V_{BRG}$ and GND and is equal to $(R_1+R_2)*R_3+R_4)/(R_1+R_2+R_3+R_4)$, ignoring the minor effects of the shunt resistor $R_{SHUNT}$. However, such effort is not required if the resulting detection limits are acceptable. As an example, this approach has a modeled worst case detection limit of $R_{shunt} < 0.10\, R_{brg}$ for a sense element having a factor of two variability to bridge resistance and initial sensitivity at 25 C.

To maximize sensitivity to excessive supply line resistance, the output should be driven as close to the voltage supply rails as possible. The limitations of the conditioning electronics' output drive need to be considered in this limiting case. The resistive loading can be applied to either full Wheatstone bridge output node and can either pull-up or pull-down either output. Pulling up a full Wheatstone bridge output while equivalently pulling down the other full Wheatstone bridge output can provide a simulated input which does not cause a change in the average value of the full Wheatstone bridge outputs. This form of loading may be advantageous in the presence of other fault modes sensitive to full Wheatstone bridge common mode voltage changes.

In accordance with the invention, the diagnostic waveform is used to test the major signal conditioning and fault reporting paths of the ASIC so that upon initialization assurance is provided that the electronics are in fact operating as intended, i.e., have not been damaged. The invention addresses bridge faults, ASIC faults and faults external to the sensor in the connection system. By seeing signals that are the expected signals during the sequencing of the first and second switches and the enabling of the common mode fault detection, assurance is provided that the above potential fault issues are not a problem. The expected waveform for each phase is at three defined potentials. At each phase, the system checks to see if the waveform is as expected, and, if not, a fault is indicated.

When a resistor is switched in parallel with the bridge resistors upon closing one of the switches, a greater than full scale stimulus (e.g., pressure) is simulated. When another resistor is switched in parallel with another bridge resistor, the opposite, less than lowest stimulus (e.g., zero pressure) is simulated. In a third phase, while maintaining the second switch closed, a fault condition is caused at the input nodes that allows a self test function for another fault detection circuit beyond the scope of this application. Thus, the output goes respectively to its full high range, full low range and to the range of reporting a fault, checking the major signal paths of the bridge and the ASIC.

With regard to a pressure sensor, some of the faults which can be detected include:

Phase 1, in which maximum stimulus input is simulated, is particularly sensitive to the existence of a series resistance in the power path to the sensor, connector, wire harness, contact resistance problems and ASIC damage, especially ASIC damage to the output stage.

Phase 2, in which minimum stimulus input is simulated, is sensitive to damage to the ASIC output and contact resistance in the return line.

Phase 3, in which the output is driven to a fault state near the high supply rail, is sensitive to power line resistance, output series resistance given a pull-down load resistor $R_{pd}$ shown in FIG. 1 and electrical damage to the ASIC which inhibits driving the output to the fault state.

The diagnostic procedure can be initiated each time the system applies a sufficient supply voltage to turn-on the conditioning circuit following a period with a supply voltage below the ASIC turn-off voltage threshold. Alternatively, the diagnostic procedure can be initiated periodically by the conditioning electronics.

The resistors to be switched can be scaled to obtain a controlled change in the bridge output. Thus, the magnitude of the signal being put into the rest of the ASIC can be controlled for testing of the entire electronic section as well as electrical shunts across the outputs of the bridge.

BRIEF DESCRIPTION OF THE DRAWINGS

Other objects, advantages and details of the novel apparatus and method of the invention appear in the following description of the preferred embodiment of the invention, the detailed description referring to the drawings in which.

DETAILED DESCRIPTION OF THE PREFERRED EMBODIMENT

Figure 1:
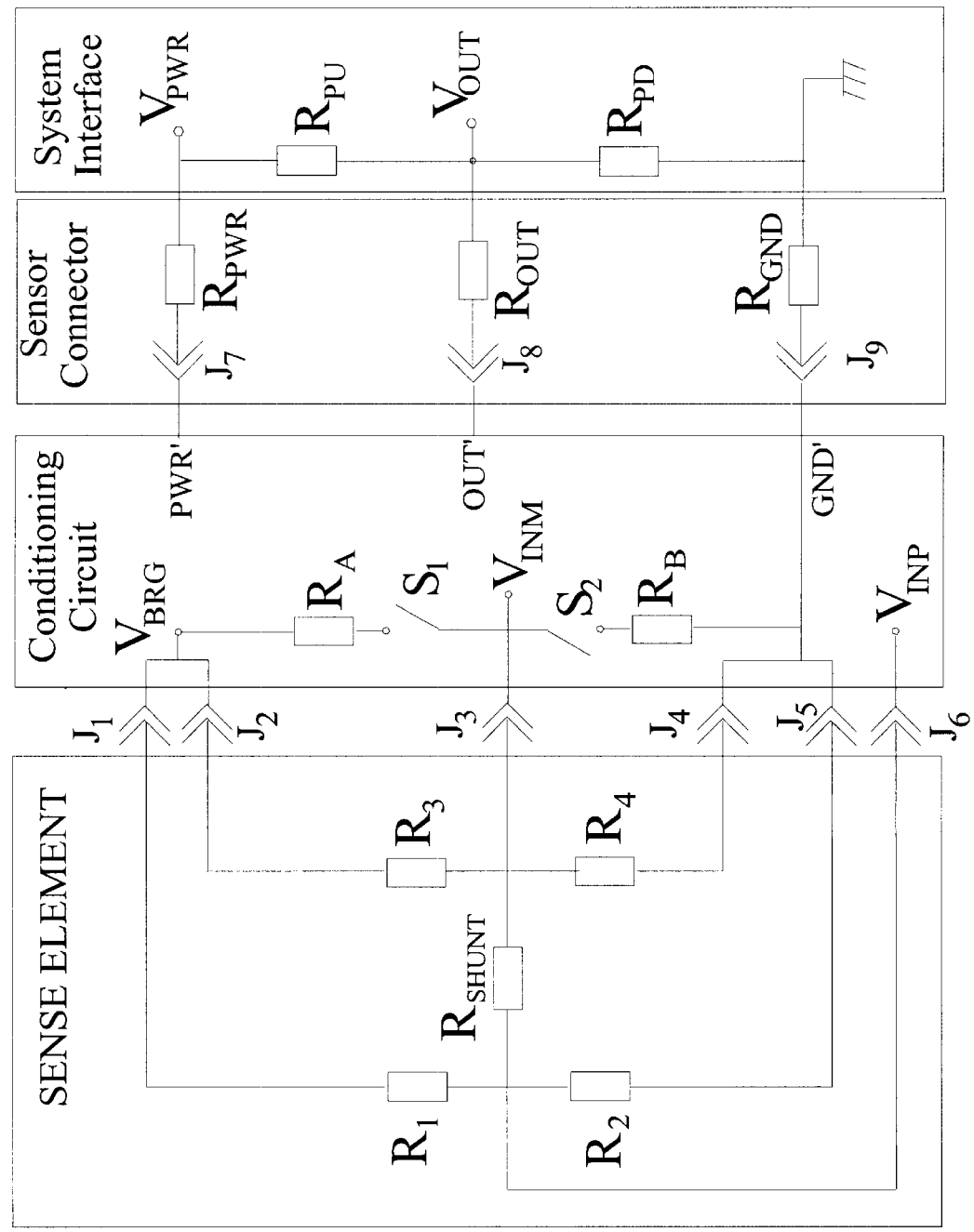
FIG. 1 is a schematic diagram of a preferred embodiment including a sense element, a conditioning circuit, a sensor connector and a system interface.

With reference to FIG. 1, a preferred embodiment of the invention comprises a sense element, electrical connectors between sense element nodes and a conditioning circuit, a conditioning circuit, a system interface and electrical sensor connectors between the conditioning circuit and the system interface.

The sense element consists of four resistive elements connected in a full Wheatstone bridge arrangement. For the purposes of fault detection, the sense element is shown having a parasitic or undesirable resistive element $R_{shunt}$ between the outputs of the full Wheatstone bridge. The electrical connectivity between the sense element and conditioning electronics consists of electrical connections J1, J2, J3, J4, J5 and J6. Each node of the sense element is connected to the conditioning electronics.

The conditioning electronics supply power to the sense element between nodes $V_{BRG}$ and GND' and signal conditions the full Wheatstone bridge outputs. The signal conditioning circuit comprises:

offset and gain compensation of the output of the full Wheatstone bridge, a diagnostic circuit made in accordance with the invention, low and high clamp levels which provide output levels limiting the maximum and minimum normal output range, and an output stage capable of driving the input impedance of the system interface.

The diagnostic function of the conditioning circuit described herein is provided by switches S1 and S2 as well as resistive elements and $R_A$ and $R_B$. As shown, switch S1 provides a means to connect resistor $R_A$ in parallel with sense element $R_3$. The sensor connector comprises electrical connections J7, J8 and J9 as well as parasitic resistive elements $R_{PWR}$, $R_{OUT}$ and $R_{GND}$. The system interface comprises load resistors $R_{PU}$ and $R_{PD}$. The electronics used to measure the signal $V_{OUT}$ is contained in the system interface, but is not shown in FIG. 1.

A closure of switch S1 will cause the voltage $V_{INM}$ to increase, which in the convention shown, will result in a negative input stimulus. Similarly, switch S2 provides a means to connector resistor $R_B$ in parallel with sense element $R_4$. A closure of switch S2 will cause the voltage $V_{INM}$ to decrease, which in the convention shown, will result in a positive input stimulus. The value of resistor element $R_A$ is selected to cause the output OUT' to reach the lower clamp level limit over all applicable tolerances of an application. For example, tolerances of sense element resistance sample to sample variability, sense element resistance thermal variability over a target application temperature range, and a similar variability for the ASIC resistor $R_A$. The value of resistor $R_B$ is selected to cause the output OUT' to reach the upper clamp level limit over all applicable tolerances of an application.

Figure 2:
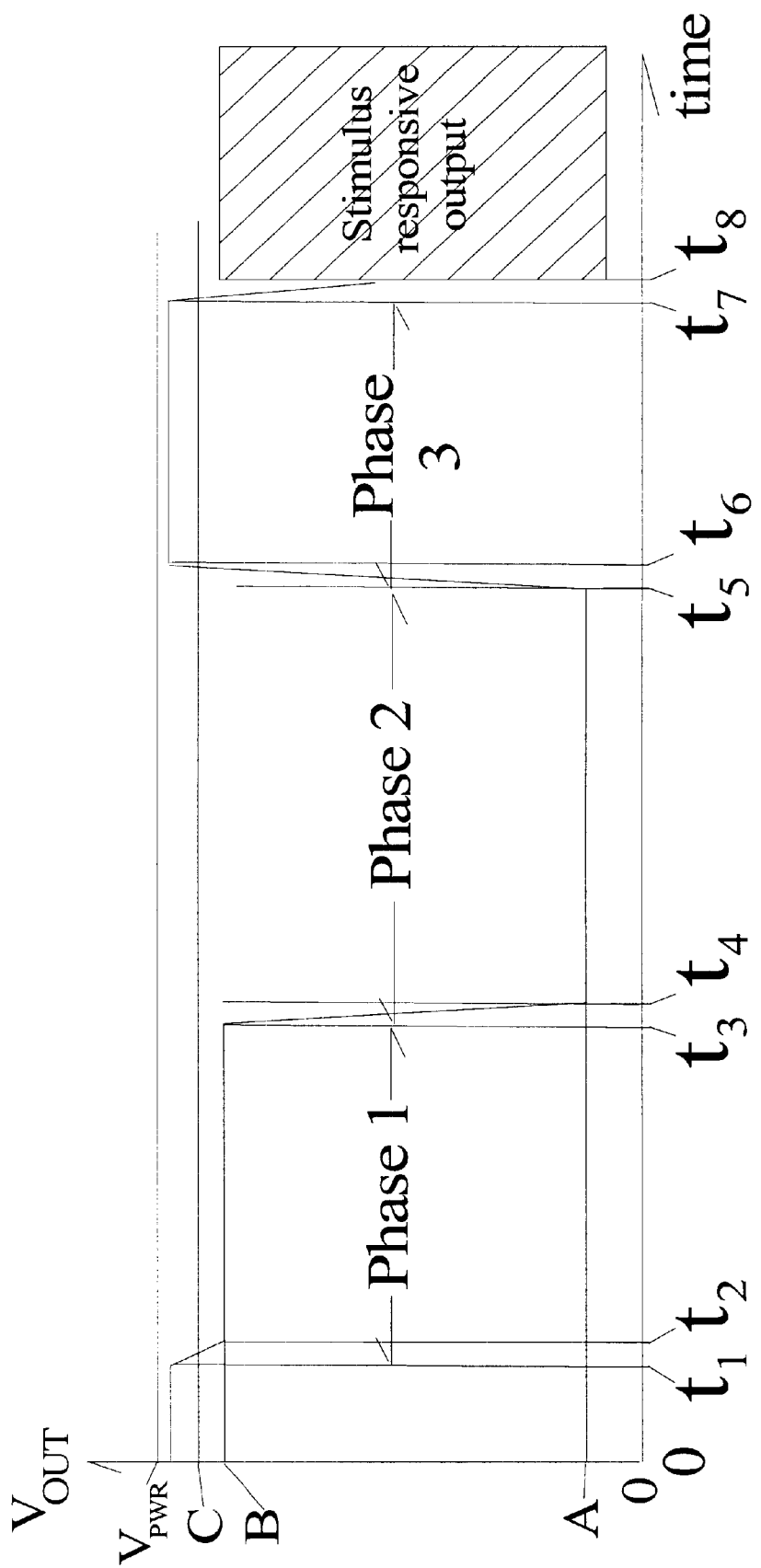
FIG. 2 is a temporal plot of output $V_{OUT}$ during the execution of a specific diagnostic phase sequencing for a normally operating sensor.

FIG. 2 shows a temporal plot of the output $V_{OUT}$ during a time sequenced actuation of switches S1 and S2 to realize a voltage waveform to provide system detectivity of sensor faults detectable by the described method. The plot shows three phases: phase 1 from $t_1$ to $t_3$, phase 2 from $t_3$ to $t_5$ and phase 3 from $t_5$ to $t_7$ with the stimulus responsive output occurring from $t_8$ onward. The time between the time reference 0 and time $t_1$ is time to allow the conditioning electronics to initialize.

The initiation of phase 1 is caused by closure of switch S2 from FIG. 1 at $t_1$. This closure causes the output OUT of the Conditioning Circuit ($V_{OUT}$ of the System Interface) to go to the upper clamp level limit B for a properly functioning sensor. Excessive parasitic resistance for element $R_{PWR}$ can prevent the output OUT' from reaching the upper clamp level B within an acceptable predetermined tolerance. Similarly, excessive parasitic resistance $R_{OUT}$ in the presence of a pull-up resistor $R_{PU}$ or pull-down resistor $R_{PD}$ can prevent the output OUT' from achieving the upper clamp level B within an acceptable predetermined tolerance. The presence of resistive shunt $R_{SHUNT}$ below a specific threshold can also prevent the output OUT' from achieving the upper clamp level B within an acceptable predetermined tolerance. The ability for output OUT' to achieve the upper clamp level B within acceptable tolerances also relies upon good electrical connectivity through connections J1, J3, J4, J6, J7, J8 and J9, all shown in FIG. 1.

Phase 1 is terminated and phase 2 is initiated by the opening of switch S2 and closure of switch S1, both shown in FIG. 1. The closure of switch S1 causes the output OUT' to decrease to the lower clamp level limit A for a properly functioning sensor. Excessive parasitic resistance for element $R_{GND}$ can prevent the output OUT' from reaching the lower clamp level A within an acceptable predetermined tolerance. Similarly, excessive parasitic resistance $R_{OUT}$ in the presence of a pull-up resistor $R_{pu}$ or pull-down resistor $R_{PD}$ or the presence of resistive shunt $R_{shunt}$ below a specific threshold can prevent output OUT' from achieving the lower clamp level A within an acceptable predetermined tolerance. The ability for output OUT' to achieve the lower clamp level within acceptable tolerances also relies upon good electrical connectivity through connections J2, J3, J5, J6, J7, J8, and J9, all shown in FIG. 1.

Phase 2 is terminated and phase 3 is initiated by enabling a fault circuit in the conditioning circuit sensitive to the sense element outputs. The ASIC detected fault causes a suppression of the upper clamp level and drives the output OUT' into an output range interpreted by the system as a fault for all outputs above a minimum fault output threshold C. Such a diagnostic circuit could either detect excessive input signals or could detect excessive changes in the average output of the sense element. This phase provides a self test for such diagnostic circuits contained in conditioning electronics.

By way of summary, as described above, the invention provides a method and apparatus to detect electrical shunts across the outputs of a full Wheatstone bridge and provides a means for a system interpreting the sensor output signal to self test the conditioning electronics. The method and apparatus provides a means for a system interpreting the sensor output signal to detect excessive supply line resistance in the PWR, GND or output. Although the invention has been described in connection with switches connected to the output voltage of the bridge sensor, it is within the purview of the invention to connect diagnostic switches to different sense element outputs, for example, one time multiplexed or two dedicated pull-up or pull-down resistors connected to each of the sense element outputs.

The invention includes all modifications and equivalents of the described embodiment falling within the scope of the appended claims.

What is claimed is:

1. A bridge sensor having a bridge supply voltage connection, a ground connection and at least one output voltage connection and conditioning electronics having an input and an output connected to the sensor connections, first and second switches connected to the input of the conditioning electronics, the first and second switches having a common terminal connected to the output voltage connection of the bridge sensor, the first switch having a normally open terminal connected to a pull-up load which in turn is connected to the bridge supply voltage connection and the second switch having a normally open terminal connected to a pull-down load which in turn is connected to the ground connection.

2. A bridge sensor according to claim 1 in which the bridge sensor comprises bridge resistors and the pull-up and pull-down loads are resistors selected to provide at least a full scale change in output voltage.

3. A bridge sensor according to claim 2 in which the pull-up and pull-down resistors are selected to cause input signals to have a magnitude slightly greater than full scale input over a full operating temperature range.

4. A bridge sensor according to claim 1 in which the bridge sensor comprises bridge resistors sensitive to a pressure stimulus and the pull-up and pull-down loads are resistors selected to provide additional resistive loading to the bridge to stimulate a selected input pressure.

5. A method for detecting faults in a resistive bridge sensor having first and second bridge halves, each half having bridge resistors and conditioning electronics connected thereto comprising the following steps:

switching a first diagnostic resistor in parallel with an individual bridge resistor in the first half bridge to produce a first diagnostic waveform representative of a maximum stimulus and comparing the first diagnostic waveform with a standard waveform for maximum stimulus.

6. A method for detecting faults in a resistive bridge sensor according to claim 5 comprising:

switching out the first diagnostic resistor, then switching in a second diagnostic resistor in parallel with another individual bridge resistor in either the first or the second half bridge to produce a second diagnostic waveform representative of a minimum stimulus and comparing the second diagnostic waveform with a standard waveform for minimum stimulus.

7. A method for detecting faults in a resistive bridge sensor having first and second bridge halves, each half having bridge resistors and conditioning electronics connected thereto comprising the following steps switching a pull-down resistor in parallel with a bridge resistor in the first half bridge to produce a first diagnostic waveform representative of full scale stimulus and comparing the first diagnostic waveform with a standard waveform for full scale stimulus.

8. A sensor having a supply voltage connection, a ground connection and at least one output connection and conditioning electronics having at least one output and at least one input connection to the sensor, first and second normally open switches connected to the at least one input connection of the conditioning electronics, the first switch being connected to a sensor output connection and a first load, and the second switch being connected to a sensor output connection and a second load, the first load being connected between the first switch and a voltage supply and the second load being connected between the second switch and a voltage supply.

9. A sensor according to claim 8 in which the sensor is a bridge sensor comprising bridge resistors and the loads are resistors selected to provide at least a full scale change in output voltage.

10. A sensor according to claim 8 in which the sensor is a bridge sensor comprising bridge resistors sensitive to pressure stimulus and the resistors are selected to provide additional resistive loading to the bridge to simulate a selected input pressure.

* * * * *